United States Patent [19]
Haque et al.

[11] Patent Number: 5,869,986
[45] Date of Patent: Feb. 9, 1999

[54] POWER LEVEL SENSE CIRCUIT

[75] Inventors: Yusuf A. Haque, San Jose; Patrick Chan, Sunnyvale, both of Calif.

[73] Assignee: Maxim Integrated Products, Inc., Sunnyvale, Calif.

[21] Appl. No.: 874,750

[22] Filed: Jun. 13, 1997

[51] Int. Cl.[6] .............................. G01R 19/00; H03L 5/00
[52] U.S. Cl. .............................. 327/61; 327/62; 327/307; 455/226.2
[58] Field of Search .............................. 455/226.1, 226.2, 455/226.4; 327/58, 61, 62, 79, 78, 307, 362

[56] References Cited

U.S. PATENT DOCUMENTS

| | | | |
|---|---|---|---|
| 4,194,240 | 3/1980 | Davis ........................................ | 327/103 |
| 4,319,196 | 3/1982 | Kwan ........................................ | 455/337 |
| 4,492,926 | 1/1985 | Kusakabe et al. ...................... | 327/306 |
| 4,630,315 | 12/1986 | Watkinson .............................. | 455/126 |
| 4,890,066 | 12/1989 | Straver et al. .......................... | 455/312 |

*Primary Examiner*—Toan Tran
*Attorney, Agent, or Firm*—Blakely, Sokoloff, Taylor & Zafman LLP

[57] ABSTRACT

A power level sense circuit which is substantially immune to variations in integrated circuit processing and operating temperature. The sense circuit uses a diode biased to a predetermined average conduction level as the primary element in an envelope detector to detect the envelope of the RF transmit signal. While the DC offset of the diode will vary with temperature and integrated circuit processing, the DC offset is eliminated by an auto zeroing procedure before each power sensing cycle.

14 Claims, 2 Drawing Sheets

POWER LEVEL SENSE CIRCUIT

BACKGROUND OF THE INVENTION

1. Field of the Invention

The present invention relates to the field of wireless communication, and more particularly to transmit power level sense circuits for maintaining transmitter power at a desired level.

2. Prior Art

The preferred embodiment of the present invention is intended for use in the mobile receivers used in cellular and other communication systems, wherein the maximum transmitter power which may be used from the mobile unit back to a base station is limited by law or regulation. By way of example, a typical cellular telephone is limited in transmit power back to a base station to 200 milliwatts, whereas a cellular phone mounted in a vehicle and communicating through a vehicle-mounted antenna is limited to a transmit power of 500 milliwatts. While the present invention is not limited to use with such systems, the preferred embodiment is specifically intended for use in cellular telephones, and accordingly, unless indicated otherwise, the following description of the prior art, and for that matter of the preferred embodiment of the invention, is directed toward cellular telephone use of the invention, most specifically in the personal unit carried by an individual, sometimes referred to as a subscriber unit, herein generally referred to simply as a "cellular telephone."

The original cellular telephones were analog units representing primarily a miniaturization of radio voice communication systems. More recently, cellular telephones have been adapted for broader usage, including adaptations to serve as a wireless communication link for fax machines, computer modems, and the like. For this purpose, current cellular telephones are microprocessor controlled systems, wherein a user may manually execute the typical telephone functions of dialing, going off hook, going back on hook, etc., and of course be provided with a typical audio input and output functions of conventional land line telephone handsets. In addition, however, the microprocessor control allows operation of the various telephone functions by modems, fax machines, and the like, so that a modem or fax machine connected to the cellular telephone may operate through the cellular system much like the same equipment operates over land line telephone systems.

In order to get maximum performance from a cellular telephone, it is desired to maintain the transmit power of the telephone as close to the legal limit as possible, as this will reduce the occurrences of loss of connection due to weak signals, will improve voice transmission quality and reduce data error rates, resulting in increased data communication rates. In prior art cellular telephones, the transmit power is usually measured by measuring the amplitude of the transmit signal by way of a conventional rectifying diode-based amplitude detector on the transmit signal. Such power level sensing circuits have the advantage of simplicity to provide a signal which, in the older analog-controlled telephones, could be used to directly control the transmit power level, and in processor-controlled cellular telephones, may be readily digitized for processor control of the transmit power. However, the rectifying diode in the peak detector is temperature sensitive, so that a transmit power control system which will maintain the transmit power within the acceptable limit over the operating temperature range of the cellular telephone will actually limit the transmit power to a level which may be significantly below the allowed level at all except the extreme temperature of the operating temperature range. In that regard, cellular telephones may be called upon to operate over a wide temperature range because of the manner in which they are used. For instance, it is not at all uncommon for a cellular telephone to be kept in a briefcase in a car, or in the glove compartment of the car, subjecting the same to temperatures ranging from the temperature of a closed-up car sitting in the sun on a hot day, to temperatures of a cold winter morning of northern climates.

BRIEF SUMMARY OF THE INVENTION

A power level sense circuit which is substantially immune to variations in integrated circuit processing and operating temperature is disclosed. The sense circuit uses a diode biased to a predetermined average conduction level as the primary element in an envelope detector to detect the envelope of the RF transmit signal. While the DC offset of the diode will vary with temperature and integrated circuit processing, the DC offset is eliminated by an auto zeroing procedure before each power sensing cycle.

DETAILED DESCRIPTION OF THE INVENTION

The present invention is a power level sense circuit intended to provide an accurate measure of the transmit power level in a radio system, in the preferred embodiment in a cellular telephone, irrespective of cellular telephone battery power supply, temperature and integrated circuit fabrication process variations, to enable the transmit power of the cellular telephone to be maintained as close to the allowed limit for transmit power as possible at all times. The preferred embodiment, of course, is intended for operation in processor-controlled cellular telephones, and accordingly provides a digital output for such use.

Figure 1:
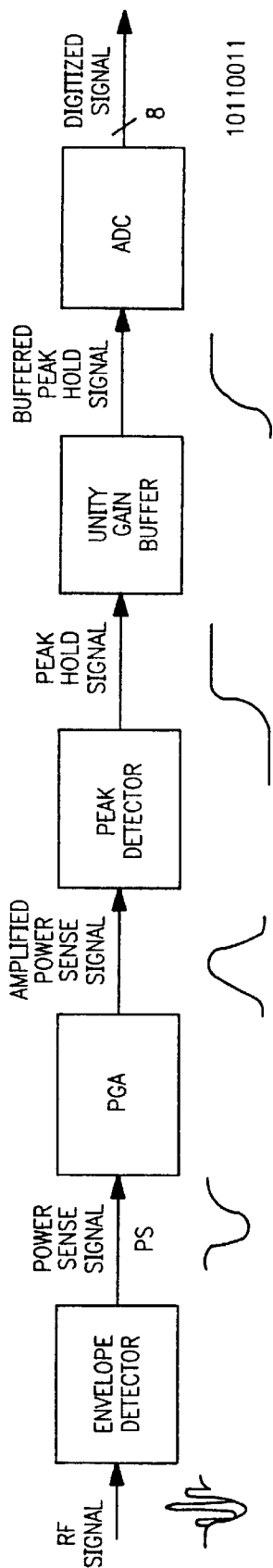
FIG. 1 is a block diagram of the power level sense circuit of the preferred embodiment of the present invention.

A block diagram of the power level sense circuit of the preferred embodiment of the present invention may be seen in FIG. 1, together with representative waveforms of the signal at various stages of the signal processing. As shown in FIG. 1, the RF (transmit) signal passes through an envelope detector which eliminates the RF signal in favor of the envelope of the RF signal, and more particularly in the preferred embodiment, the negative going envelope of the RF signal. This negative envelope, referred to as the power sense signal in FIG. 1, is amplified by the power gain amplifier PGA and inverted to provide an amplified power sense signal defining a positive going envelope. The peak detector then detects the peak of that positive going envelope to provide a peak hold signal, which is amplified by the unity gain buffer amplifier to provide a buffered peak hold signal to an analog-to-digital converter ADC, in the preferred embodiment providing an 8 bit digitized signal output to the processor. As shall be seen, the power level sense circuit of FIG. 1 operates on a cyclic basis, in that a power level measurement is taken by first resetting the circuit, then coupling the RF signal to the envelope detector and processing the signal to the digital output circuit, being reset again for the next measurement cycle, with the power measurement cycles being repeated as desired under processor control.

Figure 2:
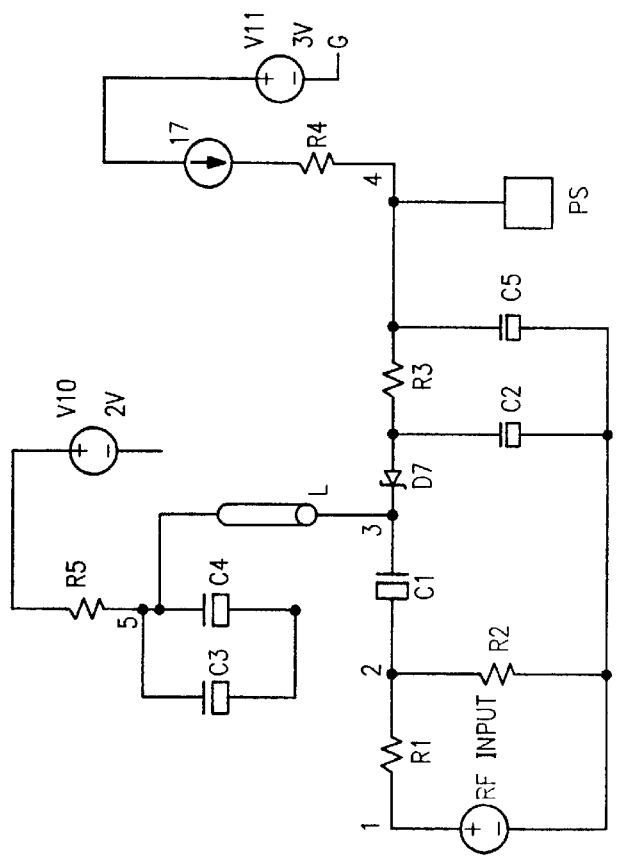
FIG. 2 is a block diagram showing details of the envelope detector of FIG. 1.

Now referring to FIG. 2, details of the envelope detector of FIG. 1 may be seen. The basic detection element in this circuit is the Schottky diode D7, the characteristics of which of course will be temperature sensitive, as well as sensitive to the integrated circuit fabrication process and the level of DC bias current therethrough. This will vary circuit to circuit and with temperature and power supply changes. However, the diode is biased to a fixed conduction point, and the envelope is detected in a relative sense around that fixed conduction point to eliminate the effects of variations in the forward conduction voltage drop of the Schottky diode due to process and temperature variations. In particular, a voltage source V11 provides headroom for current source I7, in the preferred embodiment a 100 micro amp current source. The current from current source I7 flows through resistors R4 and R3, Schottky diode D7, inductor L and resistor R5 to voltage source V10. In the preferred embodiment, the voltage source V11 is approximately 3 volts and the voltage source V1) is approximately 2 volts, with a limited voltage drop across the resistors and the inductor assuring an adequate voltage across the Schottky diode for conduction of the 100 micro amp current of current source I7. Capacitors C3 and C4 provide RF filtering so that node 5 will always be substantially free of the RF signal. In that regard, inductor L maintains the bias current in spite of the presence of RF voltage swings on node 3 of the circuit, as the inductor is large enough to prevent the high frequency voltage swings across the inductor from causing any significant change in current through the inductor.

At the beginning of a power sense cycle, the RF input is disconnected and the circuit allowed to stabilize. In this condition, the power sense signal PS will go to a voltage equal to a voltage drop across resistor R3, plus the forward conduction voltage drop across the Schottky diode D7, plus the voltage drop across inductor L and resistor R5, plus the 2 volts of voltage source V10. The power sense signal PS will stabilize at a voltage between 2 and 3 volts in the preferred embodiment, typically approximately 2.5 volts. Under this condition, the voltage across capacitor C5 will be equal to the power sense signal PS DC level, the voltage across capacitor C2 will be approximately 1/10 of a volt lower, and the voltage across capacitor C1 will be only slightly above 2 volts, the voltage of voltage source V10.

When the RF input is connected, node 2 will be driven up and down at the RF frequency. When node 2 is first driven low by the RF signal, capacitive coupling through capacitor C1 will tend to encourage node 3 low, causing charge from capacitor C2 to be delivered through diode D7 to capacitor C1 at a current level which will substantially exceed the 100 micro amps of current source I7. Thus, the DC voltage on capacitor C2 will be reduced so that when the RF signal drives node 2 high, the capacitive coupling of capacitor C1 will tend to drive node 3 high, either turning off or at least substantially reducing the current flow in diode D7. Instead, current will be provided through capacitor C1 to the inductor L to maintain the 100 micro amp current in the inductor. The average current through the diode will exceed the 100 micro amp bias current for a short period as the voltage on capacitor C2 reduces, stabilizing when the average current through diode D7 again equals the 100 micro amps of current source I7. Resistor R3 and capacitor C5 provide low pass filtering of whatever component of the RF signal may appear on capacitor C2, so that the power sense signal PS will follow or be proportional to the negative envelope of the RF input signal.

Figure 3:
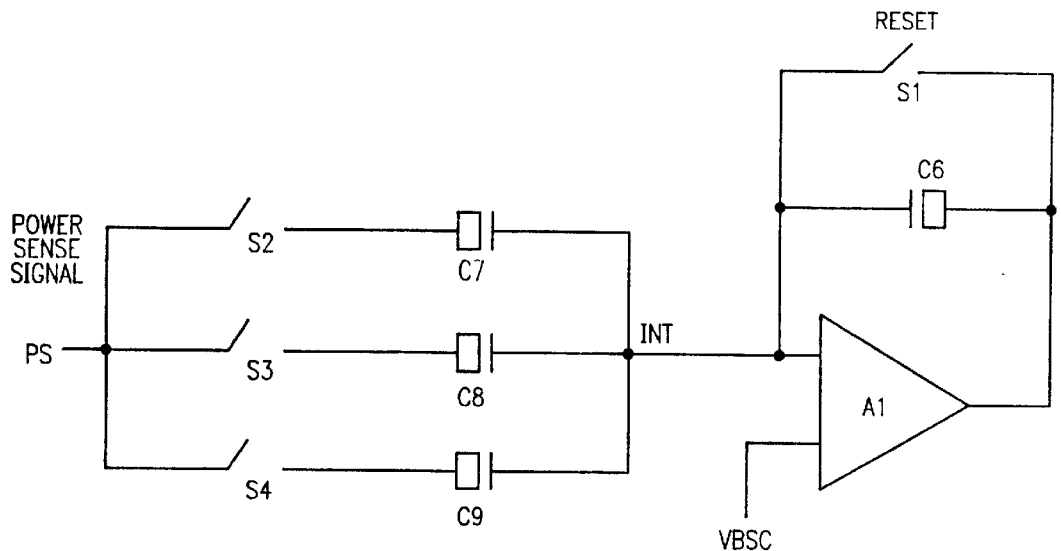
FIG. 3 is a block diagram for the power gain amplifier PGA of FIG. 1.

Now referring to FIG. 3, a block diagram for the power gain amplifier PGA of FIG. 1 may be seen. The amplifier A1 may be of a conventional operational amplifier design. In the preferred embodiment, the positive input to the operational amplifier A1 is connected to a voltage reference VBSC. The output of the amplifier is coupled back to the negative input of the amplifier through a capacitor C6, which on reset is shorted out by switch S1, typically a FET switch under processor control. The power sense signal PS from the envelope detector of FIG. 2 is also coupled to the negative input of amplifier A1 of FIG. 3 through any one of capacitors C7, C8 or C9, depending on which of switches S2, S3 and S4 are closed at the time. The selection of the coupling capacitors C7, C8 and C9 and controlling switches S2, S3 and S4 are provided in the preferred embodiment to allow the selection of any one of three gains for the amplifier, as the specific implementation in the preferred embodiment operates in three modes. On reset, the coupling of the amplifier output through switch S1 back to the negative input of the amplifier forces the negative input and thus the amplifier output to equal the positive input voltage VBSC. This causes charging of capacitor C7, C8 or C9, depending on which of switches S2, S3 and S4, respectively, is closed, to a voltage eliminating the effect of the substantial (and variable) offset which will be present in the power sense signal PS input to the PGA amplifier of FIG. 3. The negative of the offset is in effect memorized and stored on the respective capacitor C7, C8 or C9 during reset, so as to subtract the offset from the envelope being detected during the subsequent power measurement. Thus all the components of offset and variations of offset, including the variations in the forward conduction diode voltage drop in the Schottky diode due to process variations, temperature variations and power supply variations are zeroed by an equal and opposite voltage on capacitor C7, C8 or C9 by the resetting operation.

Figure 4:
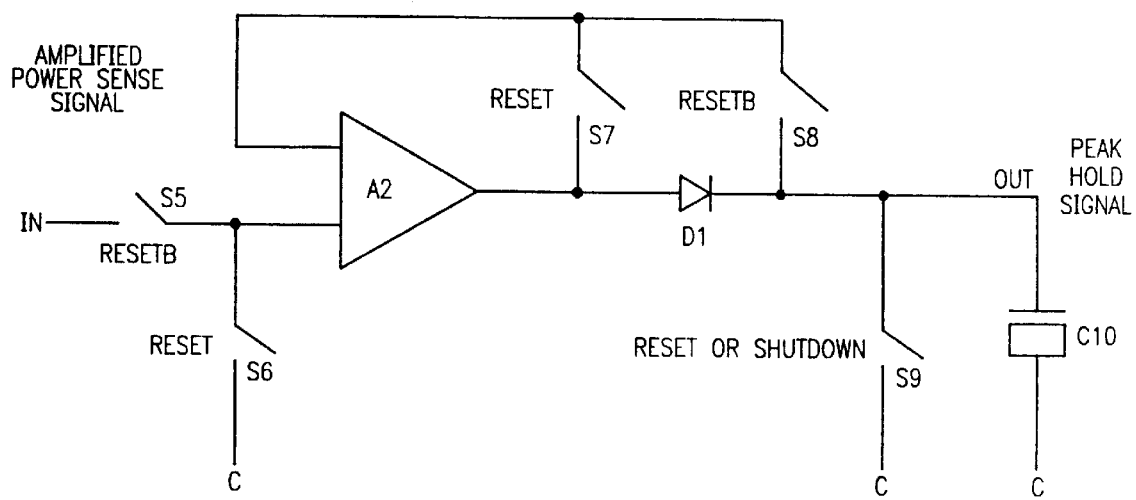
FIG. 4 is a diagram showing details of the peak detector shown in FIG. 1.

The amplified power sense signal output of the PGA amplifier of FIG. 3 is provided to a peak detector as shown in FIG. 1, the details of which are shown in FIG. 4. Here, operational amplifier A2 has its positive input coupleable under processor control by switches S5 and S6 to the output of the power gain amplifier of FIG. 3 and ground, respectively. The negative input of the amplifier is coupleable directly to the output of the amplifier by switch S7, or to the output of the amplifier through diode D1 by switch S8. The output of the amplifier is also coupled through diode D1 to holding capacitor C10, which capacitor may be discharged through switch S9 when desired. In normal operation, the switches indicated as being controlled by the reset signal RESET are open and the switches controlled by the signal RESETB, the inverse of the reset signal, are closed. This couples the output of the PGA of FIG. 3 to the input of the amplifier A2, driving the voltage on capacitor C10 through diode D1 and switch S8 back to the negative input of amplifier A2, to equal the output of the PGA. On reset, switches S5 and S8 are open and switches S6, S7 and S9 are closed, closing switch S6 and switch S7 drives the output of amplifier A2 low, so as to not provide any current through diode D1, and closing the switch S9 shorts capacitor C10 to discharge the same for the beginning of a power sense circuit cycle of operation.

Referring again to FIG. 1, it may be seen that the output of the peak detector is coupled to a unity gain buffer, which in turn is coupled to an analog-to-digital converter. The unity gain buffer and the analog-to-digital converter may be of any of the well known conventional designs, and accordingly details thereof are not provided herein.

As may be seen from the foregoing description, prior to the beginning of a power sense circuit cycle of operation, the RF signal is disconnected from the envelope detector of FIG. 2 and the circuit is allowed to stabilize. Also, the reset switch SI of the power gain amplifier of FIG. 3 is closed to discharge capacitor C6. At the same time, one of switches S2, S3 and S4 is closed, so that the respective one of capacitors C7, C8 and C9 is charged in an amount and polarity to eliminate the present offset in the power sense signal PS coupled thereto. Also at this time, switches S6, S7 and S9 of the peak detector of FIG. 4 are closed, holding the output of the amplifier A2 low and discharging capacitor C10. Then, at the beginning of the power sense cycle, switch S1 of the power gain amplifier of FIG. 3 is opened, switches S6, S7 and S9 of the peak detector are opened, and switches S5 and S8 are closed. Finally, the RF signal is coupled to the envelope detector of FIG. 2. The circuit typically will be allowed to operate for at least a few cycles of the signal frequency, which is modulated on the RF carrier, before the analog-to-digital converter is triggered to provide the desired digital output signal. Thereafter, circuit operation will be repeated, typically periodically under processor control.

It may be seen that the absolute value of the DC level of the power sense signal PS will vary with supply, temperature and integrated circuit process variations, particularly with respect to variations in the Schottky diode D7 (FIG. 1) characteristics from unit to unit and over temperature and power supply variations. However, the switched capacitor amplifier of FIG. 3 eliminates this offset so that the output is substantially free of such offsets. Further, the biasing of the Schottky diode D7 makes the envelope detector operation substantially independent of the forward conduction voltage drop of the Schottky diode or variations thereof with temperature or integrated circuit processing. Thus, accurate power measurements are provided by the present invention, unit to unit and over the operating temperature and power supply range, as is desired in such equipment as cellular telephones. While the present invention has been disclosed and described herein with respect to a preferred embodiment thereof, it will be understood by those skilled in the art that various changes in form and detail may be made therein without departing from the scope of the invention.

What is claimed is:

1. A power level sense circuit comprising:
   an envelope detector for coupling to an RF signal and providing an envelope detector output representing the envelope of the RF signal; and,
   a peak detector receiving the output of the envelope detector and providing an output representing in the peak of the envelope detector output;
   the envelope detector having a diode coupled between a first circuit for coupling to an RF signal and a second circuit providing the envelope detector output, the diode having a DC bias current there through biasing the diode into conduction when the envelope detector is not coupled to the RF signal, the second circuit being a low pass circuit having a cutoff frequency below the RF carrier frequency.

2. The power level sense circuit of claim 1 wherein the circuit providing the DC bias current through the diode includes an inductor blocking RF carrier frequencies.

3. The power level sense circuit of claim 1 wherein the output of the envelope detector is coupled to the peak detector through an operational amplifier having an input capacitor and a feedback capacitor, the feedback capacitor having a switch in parallel therewith for controllably discharging the feedback capacitor.

4. The power level sense circuit of claim 1 wherein the diode is a Schottky diode.

5. A power level sense circuit comprising:
   an envelope detector having an RF input for coupling to an RF signal and having an envelope detector output for providing an output representing the envelope of the RF signal; and,
   a peak detector receiving the output of the envelope detector and providing an output representing in the peak of the envelope detector output;
   the envelope detector having a low pass filter coupled to the output of the envelope detector, a diode coupled to the low pass filter, and a capacitor coupling the RF input to the diode, the envelope detector further having a bias circuit providing a DC bias current through the diode.

6. The power level sense circuit of claim 5 wherein the circuit providing the DC bias current through the diode includes an inductor blocking RF carrier frequencies.

7. The power level sense circuit of claim 6 wherein the output of the envelope detector is coupled to the peak detector through an operational amplifier having an input capacitor and a feedback capacitor, the feedback capacitor having a switch in parallel therewith for controllably discharging the feedback capacitor.

8. The power level sense circuit of claim 7 wherein the diode is a Schottky diode.

9. A power level sense circuit comprising:
   an envelope detector having an RF input for coupling to an RF signal and an envelope detector output for providing an output representing the envelope of the RF signal; and,
   a peak detector receiving the output of the envelope detector and providing an output representing in the peak of the envelope detector output;
   the envelope detector having a low pass filter coupled to the output of the envelope detector, a diode having a first diode connection coupled to the low pass filter, and a capacitor coupling the RF input to a second diode connection;
   the envelope detector further having a bias circuit providing a DC bias current through the diode, the bias circuit including a current source coupled to one of the diode connections and an inductor coupled to the other diode connection.

10. The power level sense circuit of claim 9 wherein the output of the envelope detector is coupled to the peak detector through an operational amplifier having an input capacitor and a feedback capacitor, the feedback capacitor having a switch in parallel therewith for controllably discharging the feedback capacitor.

11. The power level sense circuit of claim 9 wherein the diode is a Schottky diode.

12. A method of sensing power level in an RF transmitter comprising the steps of:
   providing an envelope detector having a RF coupling capacitor, a diode coupled to the coupling capacitor and a low pass filter coupled to the diode;
   providing a coupling capacitor coupling an amplifier to the low pass filter and providing a feedback capacitor for the amplifier;

providing a DC bias current through the diode;

shorting the feedback capacitor to discharge the feedback capacitor and to charge the coupling capacitor to cancel the offset from the envelope detector, and then removing the short;

coupling the RF signal to the RF coupling capacitor; and, detecting the peak of the output of the amplifier.

13. The method of claim 12 wherein the diode is a Schottky diode.

14. The method of claim 12 wherein the step of providing a DC bias current through the diode comprises the step of coupling a current source to one side of the diode and an inductor to the other side of the diode.

* * * * *